United States Patent
Davis

(10) Patent No.: US 11,204,290 B2
(45) Date of Patent: *Dec. 21, 2021

(54) GRIP SENSOR

(71) Applicant: Bradley Davis, Franklin Lakes, NJ (US)

(72) Inventor: Bradley Davis, Franklin Lakes, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/221,016

(22) Filed: Apr. 2, 2021

(65) Prior Publication Data

US 2021/0223121 A1    Jul. 22, 2021

Related U.S. Application Data

(63) Continuation of application No. 16/888,077, filed on May 29, 2020, now Pat. No. 11,015,990.

(60) Provisional application No. 62/895,759, filed on Sep. 4, 2019.

(51) Int. Cl.
*G01L 1/14* (2006.01)
*G01L 5/00* (2006.01)

(52) U.S. Cl.
CPC ............ *G01L 1/142* (2013.01); *G01L 5/0028* (2013.01)

(58) Field of Classification Search
CPC .............................. G01L 1/142; G01L 5/0028
See application file for complete search history.

(56) References Cited

U.S. PATENT DOCUMENTS

| | | | |
|---|---|---|---|
| 2,924,540 A | 2/1960 | D'Andrea | |
| 6,323,846 B1 * | 11/2001 | Westerman | G06F 3/041 345/173 |
| 6,537,182 B2 | 3/2003 | Slawinski et al. | |
| 6,749,538 B2 | 6/2004 | Slawinski et al. | |
| RE40,587 E | 11/2008 | McKinnon | |
| 9,103,131 B2 | 8/2015 | Domage | |
| 9,979,390 B2 | 5/2018 | Fujikawa et al. | |
| 10,705,666 B2 * | 7/2020 | Kring | G06F 3/04883 |
| 2004/0173603 A1 | 9/2004 | Kinouchi et al. | |
| 2008/0190642 A1 | 8/2008 | Allen et al. | |
| 2010/0038924 A1 | 2/2010 | Golz | |
| 2012/0179328 A1 | 7/2012 | Goldman-Shenhar | |
| 2017/0014078 A1 * | 1/2017 | Yamazak | A61B 5/0245 |
| 2017/0224280 A1 | 8/2017 | Bozkurt et al. | |
| 2018/0356306 A1 | 12/2018 | Campbell | |
| 2019/0326473 A1 * | 10/2019 | Choi | H01L 33/22 |

FOREIGN PATENT DOCUMENTS

DE    112017003952 T5    5/2019
EP    3227163 A1    10/2017

OTHER PUBLICATIONS

International Search Report and Written Opinion of the International Searching Authority for PCT Application No. PCT/US2020/048716, dated Nov. 12, 2020.

* cited by examiner

*Primary Examiner* — Max H Noori

(74) *Attorney, Agent, or Firm* — Budzyn IP Law, LLC

(57) ABSTRACT

Embodiments of the present invention provide robust capacitive grip sensors that may be used in a variety of applications, including single-handed and double-handed grips, such as but not limited to barbells. Apparatus as disclosed herein and efficiently measure the presence of a human grip without requiring deformation of a gripped surface area.

25 Claims, 10 Drawing Sheets

GRIP SENSOR

CROSS-REFERENCES TO RELATED APPLICATIONS

This application is a continuation of U.S. patent application Ser. No. 16/888,077, filed May 29, 2020, now pending, which claims priority to U.S. Provisional Application No. 62/895,759, filed Sep. 4, 2019, the entire contents of which are incorporated by reference herein.

FIELD OF THE INVENTION

The present invention relates to sensors, specifically, capacitive grip sensors and systems.

BACKGROUND

Grip sensors are useful in a variety of applications. Some grip sensors have a variety of shortcomings. Among these shortcomings are a) the placement of exposed wires along the circumference of the grip; b) the requirement that the surface of the grip deform in order to register an event; c) the requirement for specific hand placement in order to register a grip, and/or detection of pressure applied to specific portions of the grip; and d) in many instances, the sensor element is sufficiently delicate that the choice of topcoats and the application of these topcoats is limited out of concern that the sensor element will be compromised during assembly. A need exists for an apparatus which overcomes these shortcomings.

SUMMARY

Embodiments of the present invention provide robust capacitive grip sensors that may be used in a variety of applications, such as but not limited to barbell and dumbbell spotting apparatus. Apparatus as disclosed herein and efficiently measure the presence of a human grip without requiring deformation of a gripped surface area.

BRIEF DESCRIPTION OF THE DRAWINGS

So that those having ordinary skill in the art will have a better understanding of how to make and use the disclosed systems and methods, reference is made to the accompanying figures wherein.

DETAILED DESCRIPTION OF THE PREFERRED EMBODIMENTS

Figure 1:
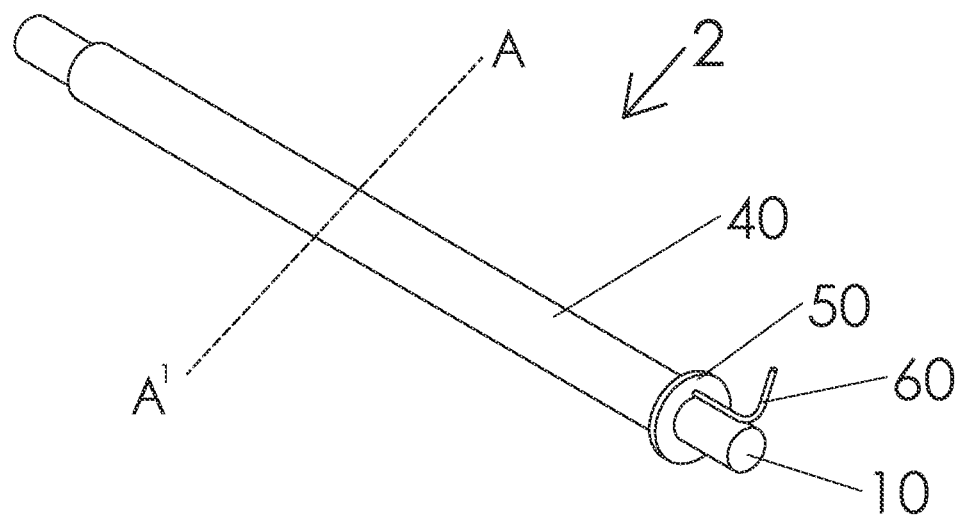
FIG. 1 is a front perspective view of a device including a grip sensor in accordance with one or more embodiments of the present disclosure.
Figure 1A:
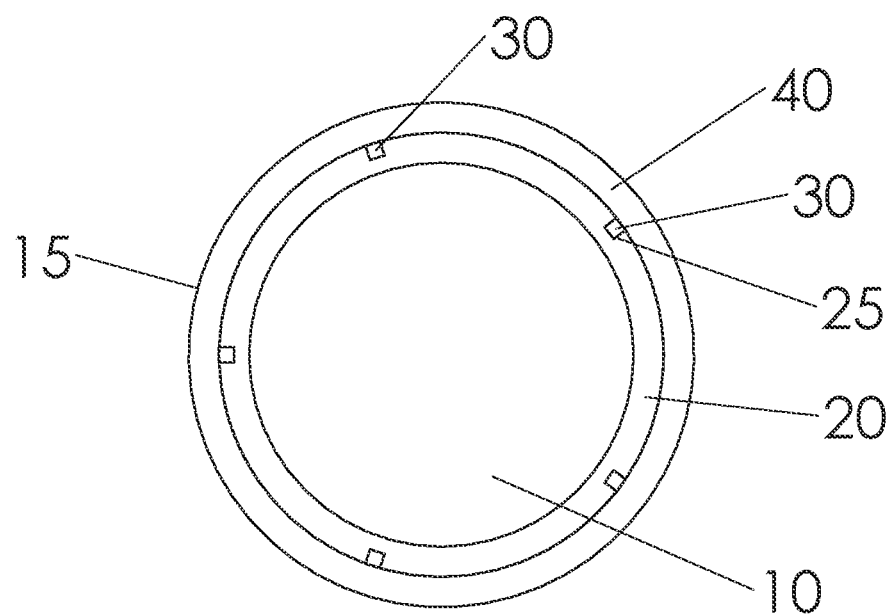
FIG. 1A is a cross-sectional view of the device of FIG. 1 taken along line A-A' in accordance with one or more embodiments of the present disclosure.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
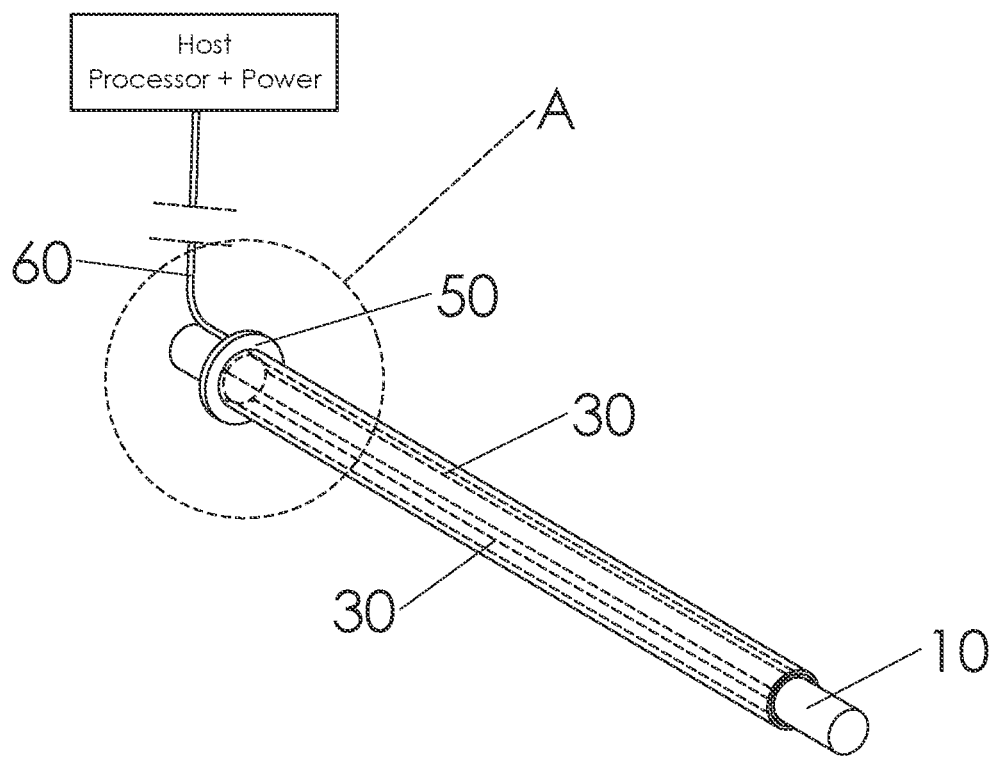
FIG. 2 is a perspective view of a device including a grip sensor with conductors shown in phantom in accordance with one or more embodiments of the present disclosure.
Figure 2A:
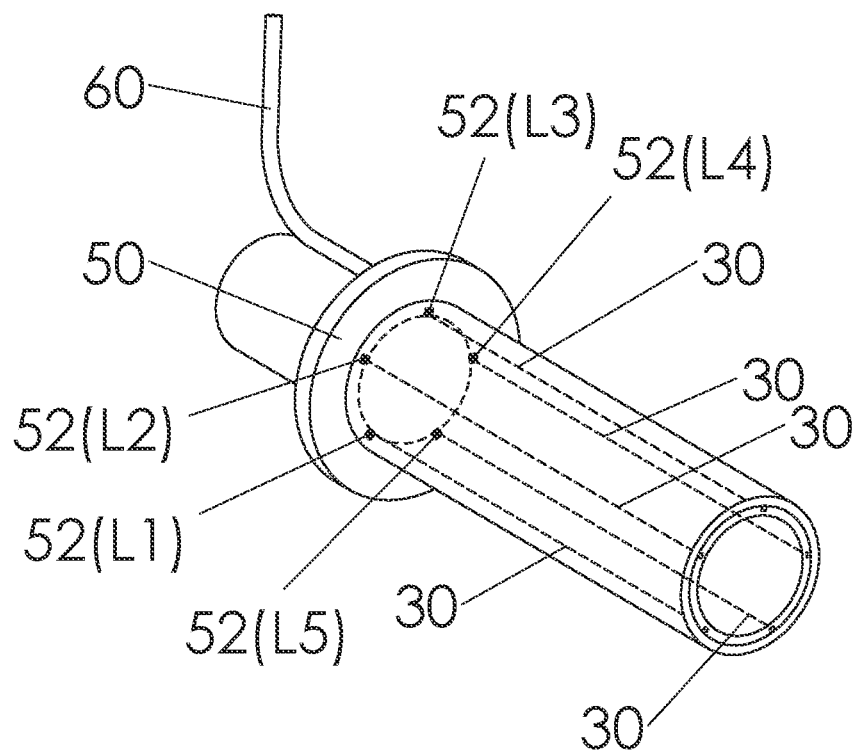
FIG. 2A is a perspective view of detail A of FIG. 2 with conductors shown in phantom in accordance with one or more embodiments of the present disclosure.
Figure 3:
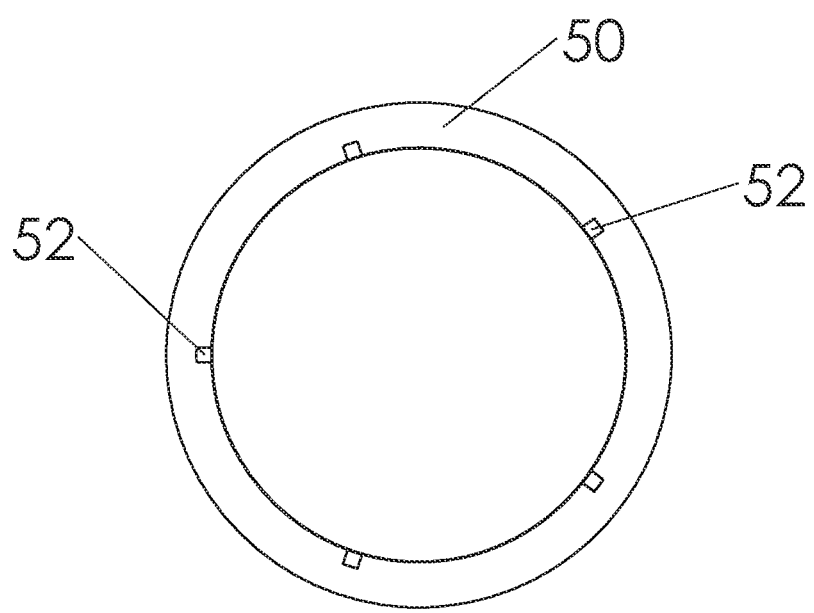
FIG. 3 is front view of a processor hub in accordance with one or more embodiments of the present disclosure.

With reference to FIGS. 1-3, an exemplary apparatus 2 includes a substrate 10, a grip sensor 15 and a processor hub 50. As shown, the substrate 10 is a bar such as but not limited to a dumbbell bar. In embodiments in which the substrate is an electrically conductive material, such as a metal barbell bar, the grip sensor 15 includes a first electrically non-conductive layer 20 positioned on the substrate 10, a plurality of strands of electrically conductive material 30 embedded in the first electrically non-conductive layer 20, a second electrically non-conductive layer 40 positioned over the strands of electrically conductive material 30, and a processor hub 50 operably coupled to the strands of electrically conductive material 30. The strands of electrically conductive material 30 are oriented along the long axis of the substrate 10 and each strand is coupled to a processor 52 positioned on the processor hub 50.

The substrate 10 may be any material typically used as a handle or grip for a device. The substrate 10 may be elongated. It will be apparent that the cross-section of the substrate 10 is not limited to a circular cross-section, as shown, but may have any suitable cross-section. The first and second electrically non-conductive layers 20 and 40 may be the same or different material. In one or more embodiments the first electrically non-conductive layer 20 and/or the second electrically non-conductive layer 40 are a ceramic material such as but not limited to a ceramic coating commercially available from Cerakote® of White City, Oreg. For example, Cerakote® H-900 Electrical Barrier ceramic coating is a suitable material. The thickness of the first electrically non-conductive layer 20 may be from 0.5-3 mm. In one embodiment the thickness of the first electrically non-conductive layer 20 is 2 mm. The thickness of the second electrically non-conductive layer 40 may be from 0.5-3 mm. In one embodiment the thickness of the second electrically non-conductive layer 40 is 2 mm.

It will be apparent to those skilled in the art when the substrate 10 is an electrically non-conductive material, such as wood, non-conductive plastic, ceramic rubber, etc., a first electrically non-conductive layer may not be required. In such cases the grip sensor 15 may include, a plurality of strands of conductive material 30 embedded in, or laid upon, the substrate 10, a non-conductive layer 40 positioned over the strands of conductive material 30, and a processor hub 50 operably coupled to the strands of conductive material 30. The grip sensor 15 may optionally include a first non-conductive layer 20.

Figure 10:
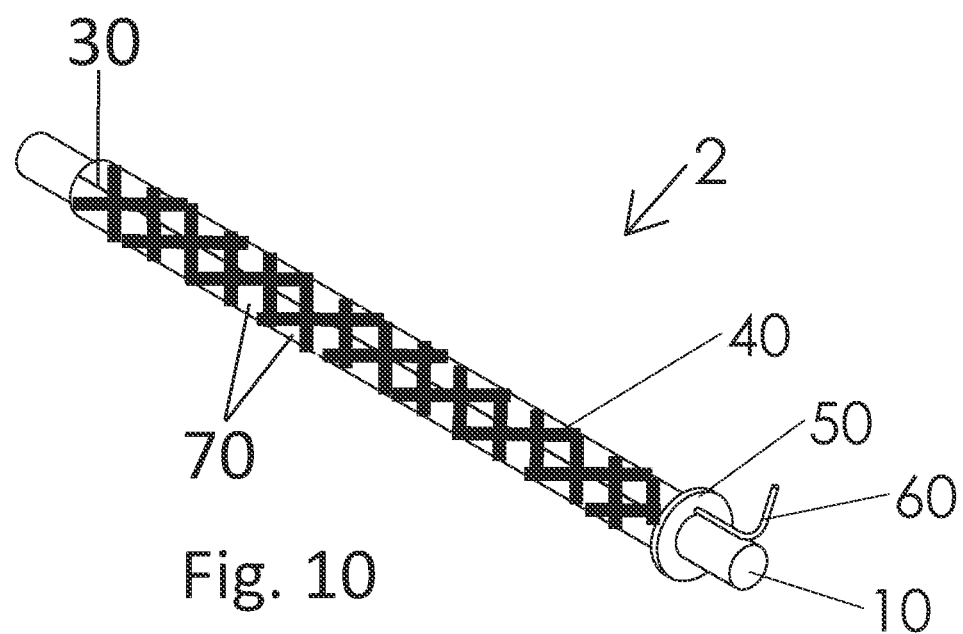
FIG. 10 is a perspective view of a device having a discontinuous second non-conductive layer in accordance with one or more embodiments of the present disclosure.

The second non-conductive layer 40 may be patterned and may include a knurled or roughened surface to facilitate grip. As shown in FIG. 1, the second non-conductive layer 40 may be continuous, with no disruptions, about the plurality of strands of conductive material 30. Alternatively, as shown in FIG. 10, the second non-conductive layer 40 may be discontinuous, defining open cells 70, exposing portions of the plurality of strands of conductive material 30. The second non-conductive layer 40 may be applied in various manners to define the open cells 70, e.g., applied as a mesh or lattice. Alternatively, the second non-conductive layer 40 may be applied continuously with subsequent removal of portions thereof to define the open cells 70, e.g., by milling or etching. The open cells 7 may be regularly formed in shape and/or regularly spaced about the substrate 10. For example, the open cells 70 may be circular or polygonal and spaced evenly to provide a honeycomb appearance.

The conductive material 30 is any suitable electrically conductive material such as but not limited to copper, silver, gold, aluminum etc. There may be any number of strands of electrically conductive material 30. The thickness of each strand 30 may be any suitable thickness, such as, for example, from 18 gauge to 23 gauge (AWG). In one embodiment the thickness is 18 gauge. Each strand of electrically conductive material 30 is coupled to a processor 52, positioned on the processor hub 50, configured to detect capacitance in the respective strand of electrically conductive material 30 and compare against a predetermined threshold to determine an above or below state of capacitance, representable in binary output. Suitable processors include but are not limited to capacitive sensor processors available commercially from ISE Controls of Indianapolis, Ind. The processors 52 are coupled to and powered by any suitable power source including but not limited to battery, house current, etc. The power source may be coupled to the processor hub 50 via conduit 60 or may be integrated in the processor hub 52. Each of the processors 52 supplies binary output (ON or OFF) for each of the strands of conductive material 30 being monitored. The level of capacitance sensed in each strand of electrically conductive material 30 may be used to determine the binary output, e.g., a level of capacitance above a predetermined threshold may represent an ON state, with a level of capacitance below the predetermined threshold representing the OFF state, or the reverse may be utilized (OFF is above the threshold, ON is below). Any type of circuit allowing for binary output may be utilized, including any suitable logic circuit. The output of each strand 30 is separate and independent from all other strands. In one or more embodiments a host-side processor receives via conduit 60 separate and distinct channels of output (ON or OFF) from each of the processors 52. For example, in a sensor with five strands (strands A-E) 30, strands A-E each can signal ON or OFF. The host-side processor interprets the output and makes its own determination how to handle the data based on logic programmed in the host-side processor. It will be apparent to those skilled in the art the host-side processor can be programmed in any number of ways to process the output from the processors 52. For example, and not by way of limitation, the five sensors may be assigned to variables L1, L2, L3, L4, L5 and provide signals as follows:

At T0 (no human interaction):

| L1 | off |
|---|---|
| L2 | off |
| L3 | off |

-continued

| | |
|---|---|
| L4 | off |
| L5 | off |

At T1.0 (palm of hand placed on the device)

| | |
|---|---|
| L1 | on |
| L2 | on |
| L3 | off |
| L4 | off |
| L5 | off |

At T2 (left hand fingers curl around the circumference of the device)

| | |
|---|---|
| L1 | on |
| L2 | on |
| L3 | on |
| L4 | on |
| L5 | on |

At T3 (the user lifts fingertips from the device but maintains a grip)

| | |
|---|---|
| L1 | on |
| L2 | on |
| L3 | on |
| L4 | off |
| L5 | off |

A host processor can process the signals to determine the presence and/or adequacy of a grip on the bar. For example, once variables L1-L5 signal ON, the host processor can signal equipment associated with the host processor to operate or not operate. The host processor may be programmed to signal equipment based on a lesser or greater number of ON signals, depending on the application. For example, the host processor may be programmed to determine an adequate grip exists based on the conditions at T3. The greater the number of electrically conductive strands and associated processors, the more sensitive the grip sensor.

The embodiment in FIGS. 1-3 is suitable for any device requiring grip sensing of a single hand.

Figure 4:
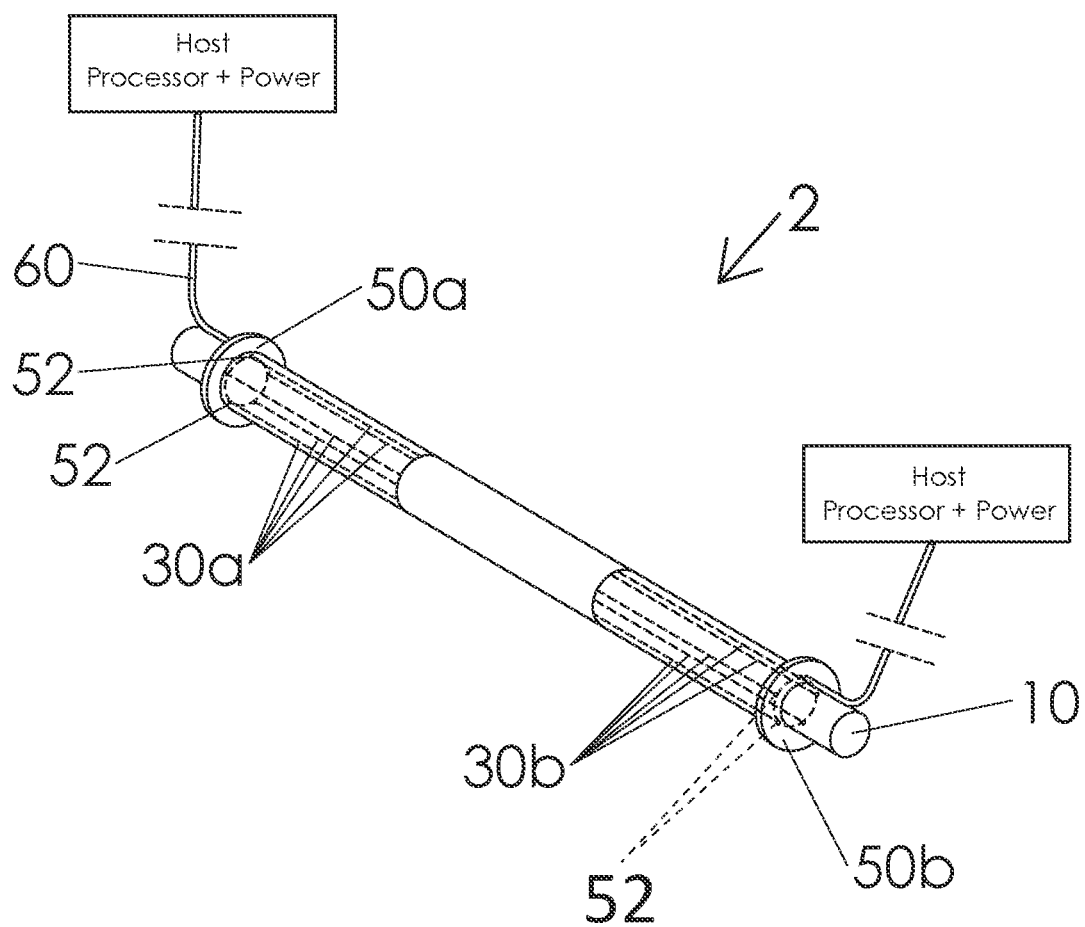
FIG. 4 is a perspective view of a device including two grip sensors with conductors shown in phantom in accordance with one or more embodiments of the present disclosure.
Figure 5:
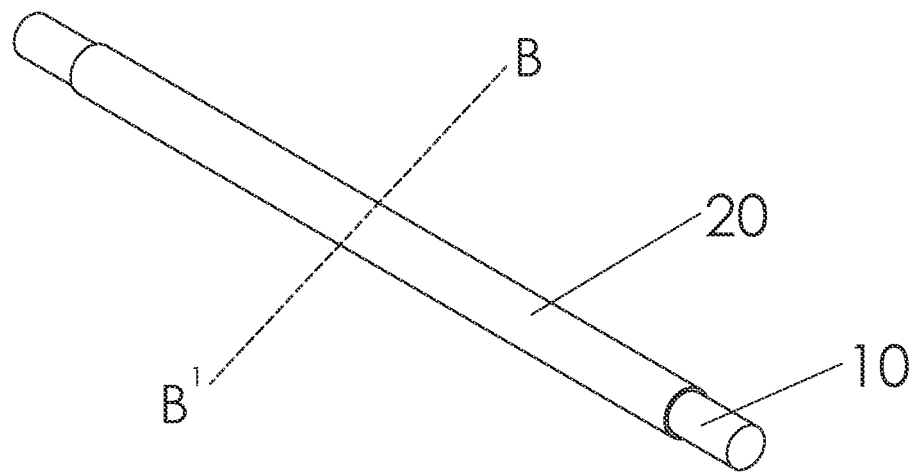
FIG. 5 is a perspective view of a substrate with a first non-conductive layer in accordance with one or more embodiments of the present disclosure.
Figure 5A:
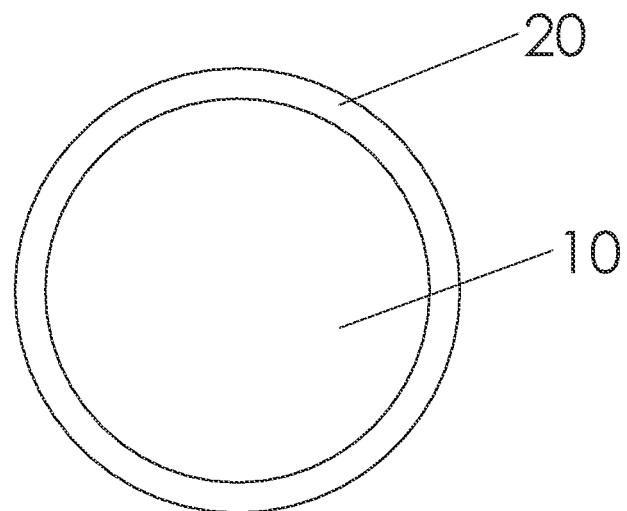
FIG. 5A is a cross-sectional view of the device of FIG. 4 taken along line B-B' in accordance with one or more embodiments of the present disclosure.

Now referring to FIG. 4, in another embodiment a device 2 is designed to detect a two-handed grip. Each strand of electrically conductive material 30a is coupled to a processor 52 positioned on the processor hub 50a, and each strand of electrically conductive material 30b is coupled to a processor 52 positioned on the processor hub 50b. The host processor may process signals received from processor hubs 50a, 50b.

For example a single device may be outfitted with grip sensors as described so that it has 10 strands of conductive material (5 on each side). Each of these is connected to its own processor 52. The processor will output either ON or OFF (binary). There are numerous examples of devices that could employ a grip sensor as disclosed herein, including but not limited to handlebars of a vehicle such as a motorcycle, a steering wheel, controls for industrial machinery, etc.

The 5 sensors on the left may be assigned to variables L1, L2, L3, L4, L5; the 5 sensors on the right may be assigned to variables R1, R2, R3, R4, R5.

At T0 (no human interaction):

| | | | |
|---|---|---|---|
| L1 | off | R1 | off |
| L2 | off | R2 | off |
| L3 | off | R3 | off |
| L4 | off | R4 | off |
| L5 | off | R5 | off |

At T1.0 (palm of left hand placed on the device)

| | | | |
|---|---|---|---|
| L1 | on | R1 | off |
| L2 | on | R2 | off |
| L3 | off | R3 | off |
| L4 | off | R4 | off |
| L5 | off | R5 | off |

At T1.1 (palm of right hand placed on the device)

| | | | |
|---|---|---|---|
| L1 | on | R1 | on |
| L2 | on | R2 | on |
| L3 | off | R3 | off |
| L4 | off | R4 | off |
| L5 | off | R5 | off |

At T2 (left hand fingers curl around the circumference of the device)

| | | | |
|---|---|---|---|
| L1 | on | R1 | on |
| L2 | on | R2 | on |
| L3 | on | R3 | off |
| L4 | on | R4 | off |
| L5 | on | R5 | off |

At T2.1 (both left and right hand fingers curl around the circumference of the device)

| | | | |
|---|---|---|---|
| L1 | on | R1 | on |
| L2 | on | R2 | on |
| L3 | on | R3 | on |
| L4 | on | R4 | on |
| L5 | on | R5 | on |

At T3 (the user lifts fingertips from the device but maintains a grip)

| | | | |
|---|---|---|---|
| L1 | on | R1 | on |
| L2 | on | R2 | on |
| L3 | on | R3 | on |
| L4 | off | R4 | off |
| L5 | off | R5 | off |

Now referring to FIGS. 5-9, an exemplary method for forming a grip sensor is provided. The disclosed method is described in the context of a grip sensor for a single hand grip, but the same principles apply to a two-handed grip sensor. In this example the substrate 10 is a metal bar with a circular cross-section having a diameter of 1 inch. With reference to FIGS. 4 and 4A, the bar is coated with Cerakote® ceramic coating. The thickness of this application is 2 millimeters. The benefits of using a ceramic are many. For example, ceramic is 1) is non-conductive, 2) cheaply and readily available, 3) efficiently applied, 4) easily etched, and 5) extremely durable (IP69K) yet able to endure deflection without cracking.

Figure 6:
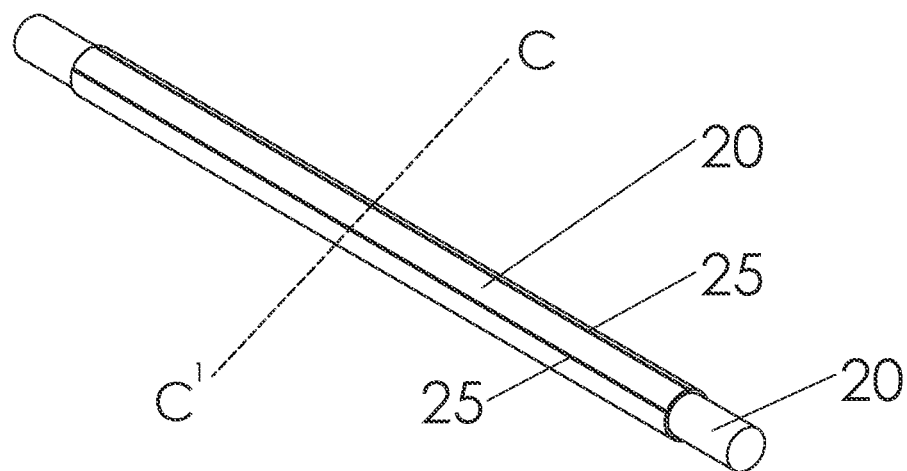
FIG. 6 is a perspective view of a substrate with a first non-conductive layer and channels formed therein in accordance with one or more embodiments of the present disclosure.
Figure 6A:
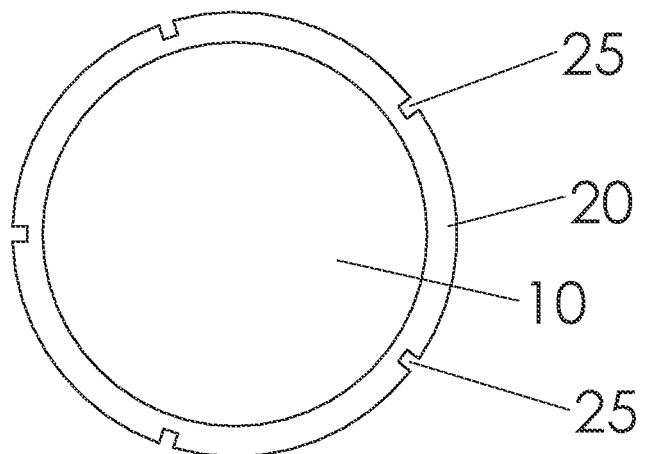
FIG. 6A is a cross-sectional view of the device of FIG. 5 taken along line C-C' in accordance with one or more embodiments of the present disclosure.

With reference to FIGS. 6 and 6A, the method involves etching into the ceramic coating 20 a plurality of channels 25, such as five channels 25, running lengthwise along the circumference of the metal bar 10. The channels 25 are equally spaced and are 1 millimeter in depth and 1 millimeter in width. It will be apparent to those skilled in the art these channels need not be precisely equally spaced and the depth and width of the channels 25 may be varied.

Figure 7:
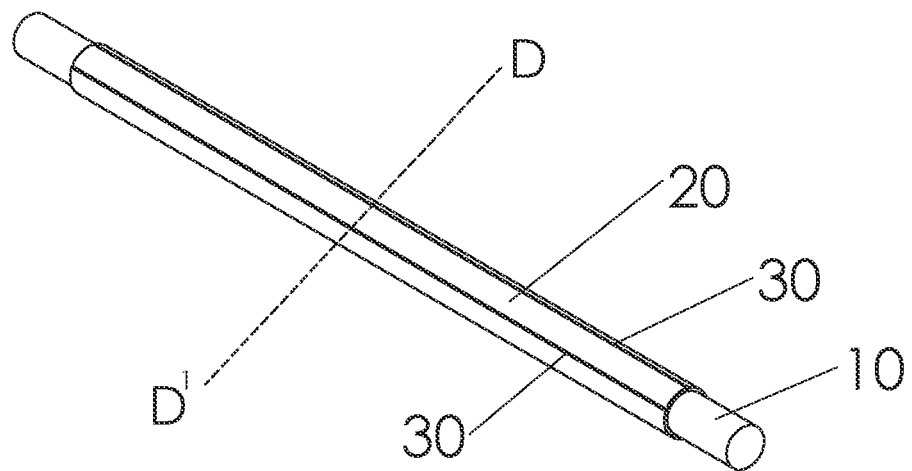
FIG. 7 is a perspective view of a substrate with a first non-conductive layer and channels formed therein and conductive material in the channels in accordance with one or more embodiments of the present disclosure.
Figure 7A:
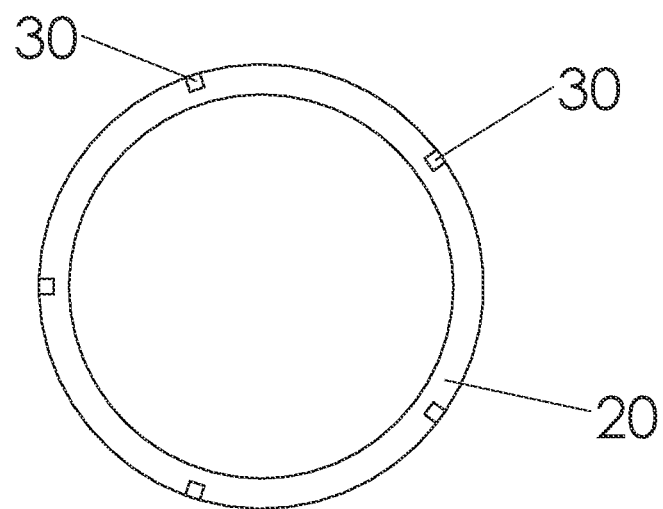
FIG. 7A is a cross-sectional view of the device of FIG. 6 taken along line D-D' in accordance with one or more embodiments of the present disclosure.

Now referring to FIGS. 7 and 7A, into each of the channels 25 is placed an uninsulated electrically conductive material 30, such as but not limited to a bare strand of solid copper. It will be apparent to those skilled in the art the conductive material 30 may be deposited using any of the well-known methods available to the skilled artisan. For example, in accordance with the teachings of James B. D'Andrea, credited with being the founder of the field of hybrid microelectronics, conductive material may be etched into or otherwise formed in ceramic with the same efficacy as soldered wiring but at a fraction of the cost, with increased accuracy, and in a tiny footprint. The conductive material may be patterned on the non-conductive layer directly without forming a channel.

Figure 8:
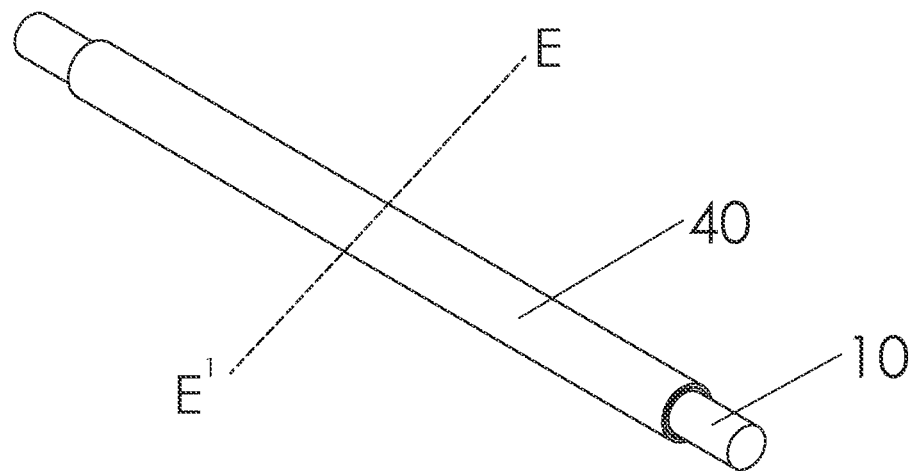
FIG. 8 is a perspective view of a substrate with a first non-conductive layer and channels formed therein, conductive material in the channels and a second non-conductive layer in accordance with one or more embodiments of the present disclosure.
Figure 8A:
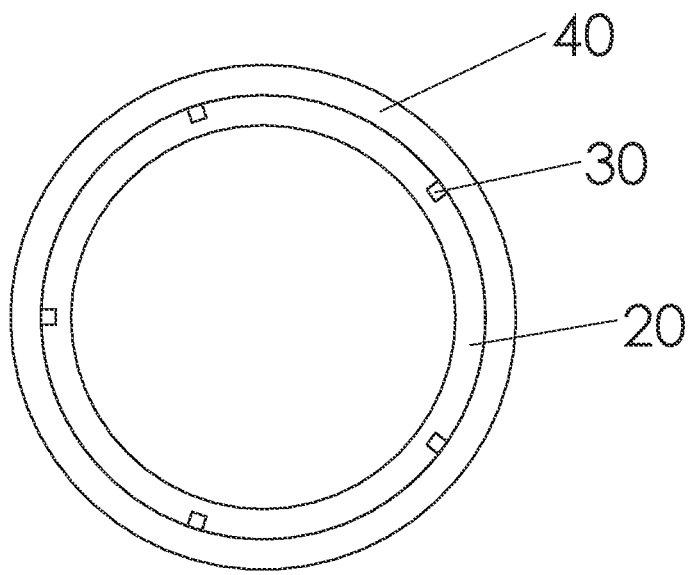
FIG. 8A is a cross-sectional view of the device of FIG. 7 taken along line E-E' in accordance with one or more embodiments of the present disclosure.

Now referring to FIGS. 8 and 8A, the second non-conductive layer 40, such as Cerakote®, is applied over the conductive material 30. Like the first non-conductive layer, the second non-conductive layer 40 is preferably uniformly applied. This coating is 2 millimeters in the example. The total incremental thickness added to the metal bar is 4 millimeters or 0.15 inches (total of 0.3 inches to the circumference).

Figure 9:
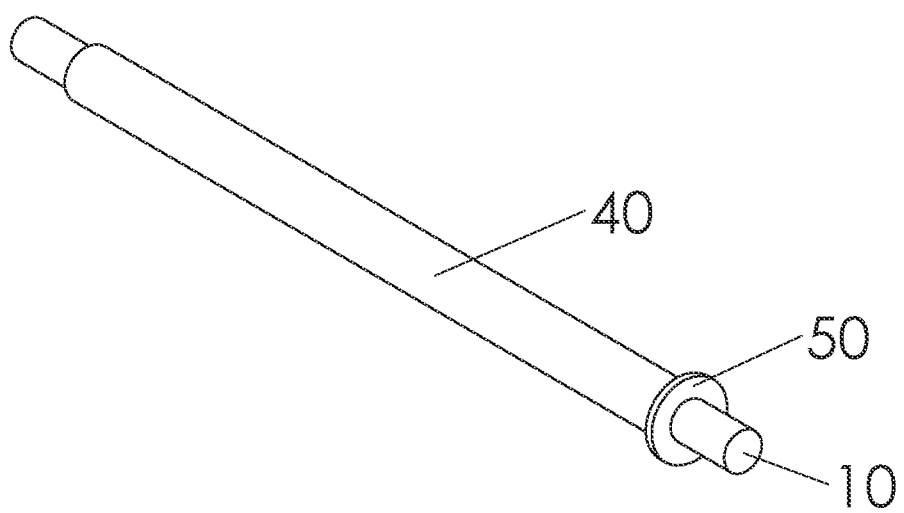
FIG. 9 is a perspective view of a device in accordance with one or more embodiments of the present disclosure.

Now referring to FIG. 9, the processor hub 50 is coupled to the metal bar so that each of the five copper strands are connected to a separate processor 52.

Although the apparatus and methods of the present disclosure have been described with reference to exemplary embodiments thereof, the present disclosure is not limited thereby. Indeed, the exemplary embodiments are implementations of the disclosed systems and methods are provided for illustrative and non-limitative purposes. Changes, modifications, enhancements and/or refinements to the disclosed systems and methods may be made without departing from the spirit or scope of the present disclosure. Accordingly, such changes, modifications, enhancements and/or refinements are encompassed within the scope of the present invention.

What is claimed is:

1. A grip detecting system for independently detecting extent of left hand and right hand engagement with spaced-apart first and second locations of an article for a user of the article, the system comprising:
   a plurality of first strands of electrically conductive material located on the article at the first location;
   a plurality of second strands of electrically conductive material located on the article at the second location;
   a first outer electrically non-conductive layer covering the plurality of first strands of electrically conductive material;
   a second outer electrically non-conductive layer covering the plurality of second strands of electrically conductive material;
   a plurality of first processors, each associated with one of the first strands of electrically conductive material, the plurality of first processors each configured to detect capacitance in the respective first strand of electrically conductive material and compare the detected capacitance against a predetermined threshold to determine an above or below state of capacitance, wherein output of the plurality of first processors collectively indicates the extent of engagement by the left hand of the user with the first location of the article; and,
   a plurality of second processors, each associated with one of the second strands of electrically conductive material, the plurality of second processors each configured to detect capacitance in the respective second strand of electrically conductive material and compare the detected capacitance against a predetermined threshold to determine an above or below state of capacitance, wherein output of the plurality of second processors collectively indicates the extent of engagement by the right hand of the user with the second location of the article.

2. A grip sensor as in claim 1, wherein a substrate underlies the plurality of first strands of electrically conductive material at the first location.

3. A grip sensor as in claim 2, wherein the plurality of first strands of electrically conductive material are spaced circumferentially about the substrate.

4. A grip sensor as in claim 3, wherein the plurality of first strands of electrically conductive material are spaced equally about the substrate.

5. A grip sensor as in claim 3, wherein the plurality of first strands of electrically conductive material are generally parallel.

6. A grip sensor as in claim 3, wherein the substrate underlies the plurality of second strands of electrically conductive material at the second location, and, wherein the plurality of second strands of electrically conductive material are spaced circumferentially about the substrate.

7. A grip sensor as in claim 6, wherein the plurality of second strands of electrically conductive material are spaced equally about the substrate.

8. A grip sensor as in claim 6, wherein the plurality of second strands of electrically conductive material are generally parallel.

9. A grip sensor useable on a substrate, the grip sensor comprising:
   an electrically non-conductive layer disposed on the substrate;
   a plurality of strands of electrically conductive material spaced circumferentially about the substrate, wherein the plurality of strands of electrically conductive material are generally parallel and are located between the electrically non-conductive layer and the substrate; and,
   a plurality of processors, each associated with one of the plurality of strands of electrically conductive material, the plurality of processors each configured to detect capacitance in the respective strand of electrically conductive material and compare the detected capacitance against a predetermined threshold to determine an above or below state of capacitance, representable in binary output,
   wherein, the output of the plurality of processors collectively indicates an extent of engagement by a hand of a user with the electrically non-conductive material above the plurality of strands of electrically conductive material.

10. A grip sensor as in claim 9, wherein a first subset of the plurality of strands of electrically conductive material includes a first strand, a second strand, and a third strand of the plurality of strands of electrically conductive material, the first, second, and third strands being in succession circumferentially about the substrate, wherein, a second subset of the plurality of strands of electrically conductive material includes a fourth strand and a fifth strand of the plurality of strands of electrically conductive material, the fourth and fifth strands being in succession circumferentially about the substrate, wherein, contact by a user's hand simultaneously across the strands of the first subset collectively generates an output representative of fingers of the user being in contact with the electrically non-conductive layer, wherein, contact by the user's hand simultaneously across the strands of the second subset collectively generates an output representative of a palm of the user being in contact with the electrically non-conductive layer, and, wherein, contact by the user's hand simultaneously across the strands of the first and second subsets collectively generates an output representative of the fingers and palm of the user being in contact with the electrically non-conductive layer.

11. A grip sensor as in claim 9, wherein, the output of each of the plurality of processors is aggregated based on positioning of the plurality of strands of electrically conductive material to determine the collective output of the plurality of processors.

12. A grip sensor as in claim 11, wherein the positioning of the plurality of strands of electrically conductive material is based on succession circumferentially about the substrate.

13. A grip sensor as in claim 9, wherein a second electrically non-conductive layer is disposed between the plurality of strands of electrically conductive material and the substrate.

14. A grip sensor as in claim 9, wherein the plurality of processors is included in a processor hub.

15. A grip sensor as in claim 14, wherein the processor hub includes a battery.

16. A grip sensor as in claim 14, wherein the processor hub is electrically coupled to a source of power.

17. A grip sensor as in claim 9, wherein the electrically non-conductive layer is continuous.

18. A grip sensor as in claim 9, wherein the electrically non-conductive layer is discontinuous with a plurality of open cells being defined therein.

19. A grip sensor as in claim 18, wherein the open cells are circular or polygonal.

20. A grip sensor as in claim 18, wherein the open cells are evenly spaced.

21. A grip sensor as in claim 9, wherein the electrically non-conductive layer is formed of ceramic material.

22. A grip sensor as in claim 13, wherein the second electrically non-conductive layer is formed of ceramic material.

23. A grip sensor as in claim 9, wherein the plurality of strands of electrically conductive material are spaced equally about the substrate.

24. A grip sensor as in claim 9, wherein the thickness of the electrically non-conductive layer is in the range of 0.5-3.0 mm.

25. A grip comprising:
a substrate; and,
a grip sensor as in claim 9.

* * * * *